United States Patent
Yang et al.

(10) Patent No.: US 11,917,849 B2
(45) Date of Patent: Feb. 27, 2024

(54) QUANTUM DOT LIGHT EMITTING DIODE AND METHOD FOR FABRICATING THE SAME

(71) Applicant: TCL TECHNOLOGY GROUP CORPORATION, Huizhou (CN)

(72) Inventors: Chengyu Yang, Huizhou (CN); Yixing Yang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 962 days.

(21) Appl. No.: 16/612,671

(22) PCT Filed: Mar. 14, 2018

(86) PCT No.: PCT/CN2018/079009
§ 371 (c)(1),
(2) Date: Dec. 22, 2020

(87) PCT Pub. No.: WO2018/205741
PCT Pub. Date: Nov. 15, 2018

(65) Prior Publication Data
US 2021/0111370 A1    Apr. 15, 2021

(30) Foreign Application Priority Data

May 11, 2017   (CN) .......................... 201710329096.X

(51) Int. Cl.
*H10K 50/844*   (2023.01)
*H10K 50/115*   (2023.01)
(Continued)

(52) U.S. Cl.
CPC ........... *H10K 50/844* (2023.02); *H01L 33/56* (2013.01); *H10K 50/115* (2023.02); *H10K 71/00* (2023.02)

(58) Field of Classification Search
CPC .... H10K 50/844; H10K 50/115; H10K 71/00; H01L 33/56
See application file for complete search history.

(56) References Cited

U.S. PATENT DOCUMENTS

2014/0027713 A1\*   1/2014   Cox ................... H01L 33/0087
438/47

FOREIGN PATENT DOCUMENTS

CN            1539896 A         10/2004
CN         102250279 A    \*  11/2011
(Continued)

*Primary Examiner* — David A Zarneke

(57) ABSTRACT

A quantum dot light emitting diode and a method for fabricating the same. The quantum dot light emitting diode includes: a substrate, a bottom electrode, a light-emitting function layer, and a top electrode. A functional layer is formed by the bottom electrode, the light-emitting function layer, and the top electrode; and an outer surface of the functional layer is provided with a first protective layer. The first protective layer is made from a fluoro-acrylate copolymer, which has hydrophobicity, good light transmittance, flexibility, and heat dissipation, and can effectively prevent moisture and oxygen from penetrating into an internal structure of the quantum dot light emitting diode, thereby having a good protection effect, and in the meanwhile, the quantum dot light emitting diode can dissipate heat timely, which is beneficial for the device to keep its performance, improve light-emitting efficiency, and the service life.

16 Claims, 3 Drawing Sheets

(51) Int. Cl.
*H10K 71/00* (2023.01)
*H01L 33/56* (2010.01)

(56) References Cited

FOREIGN PATENT DOCUMENTS

| | | |
|---|---|---|
| CN | 103805017 A | 5/2014 |
| CN | 104448712 A | 3/2015 |
| CN | 105073900 A | 11/2015 |
| CN | 106058065 A | 10/2016 |
| CN | 106252530 A | 12/2016 |
| CN | 106536656 A | 3/2017 |
| KR | 20120138165 A | 12/2012 |
| TW | 201539781 A | 10/2015 |

* cited by examiner

QUANTUM DOT LIGHT EMITTING DIODE AND METHOD FOR FABRICATING THE SAME

CROSS-REFERENCE TO RELATED APPLICATION

This application is a 35 U.S.C. § 371 national stage application of PCT Application Ser. No. PCT/CN2018/079009, filed on Mar. 14, 2018, which claims priority to Chinese Patent Application Ser. No. CN20170329096.X, filed on May 11, 2017, the entire contents of which are incorporated herein by reference in its entireties.

TECHNICAL FIELD

The present application relates to the technical field of display application, and more particularly to a quantum dot light emitting diode (QLED) and a method for fabricating the same.

BACKGROUND

The quantum dot light emitting diode (QLED) is advantageous in its high color purity, light-weight, flexibility, etc., and is highly expected to be a next generation display technique.

However, the existing OLED device itself has relatively poor water-proof and oxygen-proof performances, water and oxygen in the air easily penetrate into the internal part of the QLED device and affect the performance of the device, therefore, the commercial application of such device is affected. If the QLED device can be sealed in a water-free environment, the service life of the QLED device can be significantly prolonged. However, this may lead to other problems: first, because the QLED device tends to produce a large quantity of heat during operation, it is difficult for the package structure in the prior art to balance the sealing performance and the heat dissipation performance, the sealed environment in the package process causes the heat produced by the QLED device unable to dissipate timely, which makes the temperature of the whole display device rise, and in turn affects the efficiency and the service life thereof. In addition, most QLED devices are packed with UV curable adhesive, although the QLED device packed by such method has improved water-proof and oxygen-proof performances, such method requires additional instrument to be purchased, which increases the production cost; and it is also possible that the UV lamp irradiation may damage the organic layer of the QLED device and affect the device performance. Moreover, the package may diminish the transparency and flexible display of the QLED device, which in turn reduces the luminous efficiency of the QLED.

Therefore, the existing QLED device has problems of poor waterproof and oxygen-proof performances, low heat dissipation performance, short service life, low luminous efficiency, and high production cost.

Technical Problems

It is an object of the present application to provide a quantum dot light emitting diode and a method for fabricating the same, which aim at solving the problems that the existing quantum dot light emitting diode has poor waterproof and oxygen-proof performances, low heat dissipation performance, short service life, low luminous efficiency, and high production cost.

Technical Solutions

In order to achieve the above objects, the present application adopts the following technical solutions:

The present application provides a quantum dot light emitting diode, comprising: a substrate, a bottom electrode, a light-emitting function layer, and a top electrode arranged in sequence. A functional layer is formed by the bottom electrode, the light-emitting function layer, and the top electrode; and an outer surface of the functional layer is provided with a first protective layer made from a fluoro-acrylate copolymer.

The present application further provides a method for fabricating the above-described quantum dot light emitting diode. The method comprises the steps of:

preparing a fluoro-acrylate copolymer solution, in which the fluoro-acrylate copolymer solution is obtained by dissolving the fluoro-acrylate copolymer in an organic solvent;

providing the substrate;

sequentially depositing the bottom electrode, the light-emitting function layer, and the top electrode on the substrate; and depositing the fluoro-acrylate copolymer solution on the outer surface of the functional layer formed by the bottom electrode, the light-emitting function layer, and the top electrode, to form the first protective layer.

Beneficial Effects

The quantum dot light emitting diode provided by an embodiment of the present application includes the substrate and the functional layer formed by the bottom electrode, the light-emitting function layer, and the top electrode. An outer surface of the functional layer is covered with the first protective layer. The first protective layer is made from the fluoro-acrylate copolymer, which has hydrophobicity, good transmittance, flexibility, and heat dissipation, and can effectively prevent water and oxygen from penetrating into the internal structure of the quantum dot light emitting diode, thereby having good protection effect. In the meanwhile, the quantum dot light emitting diode can dissipate heat timely during operation, which is beneficial for the device to work better, improve the light-emitting efficiency, and prolong the service life thereof.

The method for preparing the quantum dot light emitting diode provided by the present application is achieved by preparing the fluoro-acrylate copolymer solution, depositing the fluoro-acrylate copolymer solution onto the outer surface of the functional layer, which is formed by the bottom electrode, the light-emitting function layer, and the top electrode, so as to form the first protective layer, thereby effectively blocking water and oxygen from penetrating into the internal structure of the quantum dot light emitting diode. The method is simple and easy to control, and has relatively good application prospect.

DETAILED DESCRIPTION OF THE EMBODIMENTS

To make the objects, technical solutions, and advantages of the present application more clear, the present application will be further described in detail below with reference to the accompanying drawings and embodiments. It should be understood that the specific embodiments described herein are merely illustrative of the application and are not intended to limit the application.

In the description of the present application, it is to be understood that the terms "first" and "second" are used for descriptive purposes only and are not to be construed as indicating or implying relative importances or implicitly indicating the number of technical features indicated. Thus, features defining "first" and "second" may include one or more of the features either explicitly or implicitly. In the description of the present application, unless otherwise specifically defined, the meaning of "a plurality" means two or more.

Figure 1:
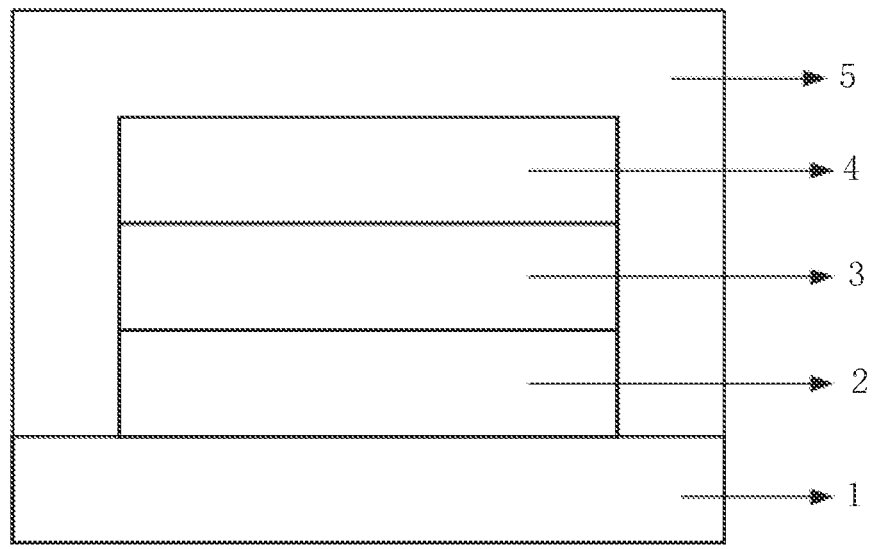
FIG. 1 is a schematic structural diagram of a quantum dot light emitting diode according to an embodiment of the present application.
Figure 2:
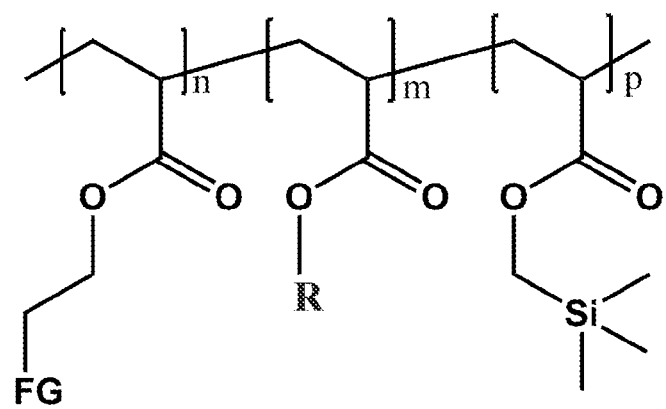
FIG. 2 is a molecular structure diagram of a fluoro-acrylate copolymer provided by an embodiment of the present application.
Figure 3:
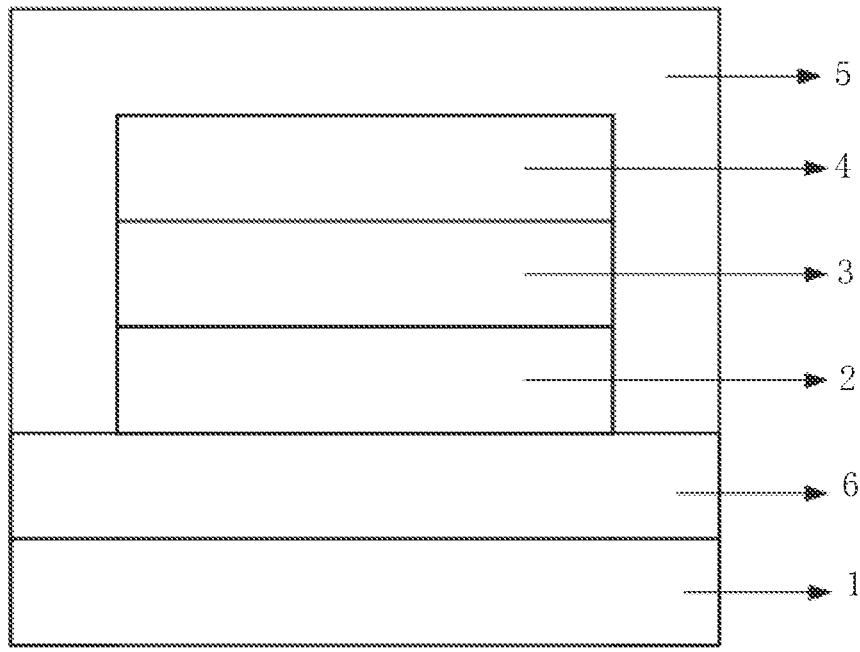
FIG. 3 is a schematic structural diagram of another quantum dot light emitting diode according to an embodiment of the present application.

In conjunction with FIGS. 1-3, a quantum dot light emitting diode is provided by an embodiment of the present application, as shown in FIG. 1, and includes: a substrate 1, a bottom electrode 2, a light-emitting function layer 3, and a top electrode 4 arranged in sequence. An outer surface of a functional layer, which is formed by the bottom electrode 2, the light-emitting function layer 3, and the top electrode 4, is provided with a first protective layer 5, which is made from a fluoro-acrylate copolymer.

In an embodiment of the present application, the first protective layer 5 is provided on the outer surface of the functional layer, which is formed by the bottom electrode 2, the light-emitting function layer 3, and the top electrode 4. The first protective layer 5 covers the outer surface of the quantum dot light emitting diode except a bottom of the substrate 1, so as to prevent moisture and oxygen from penetrating into the internal structure of the quantum dot light emitting diode. Herein, the outer surface specifically refers to a surface region of the device that is in contact with the external environment, except the bottom of the substrate 1, before providing the first protective layer 5; and the outer surface of the functional layer formed by the bottom electrode 2, the light-emitting function layer 3, and the top electrode 4 means other outer surfaces except the bottom of the substrate 1.

Specifically, the first protective layer 5 is a protective layer made from the fluoro-acrylate copolymer. A molecular structure of the fluoro-acrylate copolymer is shown in FIG. 2 (in which, R represents an alkane group, and a specific molecular formula thereof may be different according to raw materials for preparing the fluoro-acrylate copolymer; n, m, and p respectively represent an average value of the number of unit repeats in the corresponding polymer macromolecular chain, specifically, n is an integer of from 1 to 50, m is 1 an integer of from 1 to 10000, p is an integer of from 1 to 50, preferably n is an integer of from 10 to 30, m is an integer of from 500 to 7000, and p is an integer of from 10 to 30), and includes a fluorine-containing functional group (—FG). The fluorine-containing functional group is a functional group structure including, but not limited to, at least one selected from $-C_2F_5$, $-C_3F_7$, $-C_4F_9$, $-C_5F_{11}$, $-C_6F_{13}$, $-C_7F_{15}$, and $-C_8F_{17}$. In other words, fluorine-containing functional group in the fluoro-acrylate copolymer may include any two functional group structures selected from $-C_2F_5$, $-C_3F_7$, $-C_4F_9$, $-C_5F_{11}$, $-C_6F_{13}$, $-C_7F_{15}$, and $-C_8F_{17}$, for example, $-C_2F_5$ and $-C_3F_7$, $-C_4F_9$ and $-C_5F_{11}$, $-C_6F_{13}$ and $-C_7F_{15}$, $-C_2F_5$ and $-C_8F_{17}$, etc. Fluorine-containing functional group in the fluoro-acrylate copolymer may include any three functional group structures selected from $-C_2F_5$, $-C_3F_7$, $-C_4F_9$, $-C_5F_{11}$, $-C_6F_{13}$, $-C_7F_{15}$, and $-C_8F_{17}$, for example, $-C_2F_5$, $-C_3F_7$ and $-C_4F_9$; $-C_5F_{11}$, $-C_6F_{13}$ and $-C_7F_{15}$; $-C_6F_{13}$, $C_7F_{15}$, and $-C_8F_{17}$; etc. Fluorine-containing functional group in the fluoro-acrylate copolymer may include any four functional group structures selected from $-C_2F_5$, $-C_3F_7$, $-C_4F_9$, $-C_5F_{11}$, $-C_6F_{13}$, $-C_7F_{15}$, and $-C_8F_{17}$, for example, $-C_2F_5$, $-C_3F_7$, $-C_4F_9$ and $-C_5F_{11}$; $-C_5F_{11}$, $-C_6F_{13}$, $-C_7F_{15}$ and $-C_8F_{17}$; $-C_3F_7$, $-C_4F_9$, $-C_5F_{11}$, and $-C_6F_{13}$; etc. And preferably, the fluoro-acrylate copolymer that adopts the functional group structure including $-C_2F_5$, $-C_3F_7$, $-C_4F_9$, $-C_5F_{11}$, $-C_6F_{13}$, $-C_7F_{15}$, or $-C_8F_{17}$ is used as the material of the first protective layer 5. The preferred material is adhesive and hydrophobic, and can be in full contact with the region to be protected, so as to isolate the region to be protected from oxygen and air. The preferred material also has good light transmission and heat dissipation, and can realize full package including the substrate 1, which effectively prevents moisture and oxygen from penetrating into the internal structure of the quantum dot light emitting diode, thereby having good protection effect, in the meanwhile, allows the quantum dot light emitting diode to dissipate heat timely during operation, which is beneficial for the device to work better, improve the light-emitting efficiency, and prolong the service life thereof. In addition, the preferred material does not react with other layers of the quantum dot light emitting diode, and is inexpensive in production, environmentally friendly, and non-toxic to humans.

In an embodiment of the present application, because the first protective layer 5 covers the outer surface of the quantum dot light emitting diode except the bottom of the substrate 1, the first protective layer 5 has relatively great influence on the light-emitting efficiency of the light-emitting function layer 3 of the quantum dot light emitting diode. In order to prevent the penetration of the water and oxygen and at the same time ensure the light-emitting efficiency of the quantum dot light emitting diode, the first protective layer 5 is preferably a nano-sized protective layer, in order to further improve the light transmittance of the protective layer. More preferably, the first protective layer 5 is a membrane having a thickness of from 50 to 300 nm. The preferable thickness enables the first protective layer 5 to have good transmittance, which, on the premise of effectively preventing water or oxygen from penetration, further improves the transmittance of the protective layer. In the meanwhile, the preferred thickness enables the first protective layer 5 to have flexibility and toughness, which is beneficial for the protection of flexible quantum dot light emitting diode.

In an embodiment of the present application, the selection of the substrate 1 is not limited, a flexible substrate or a rigid substrate may be employed. The flexible substrate may specifically be a flexible polymer substrate; and the hard substrate may specifically be a glass substrate or a metal substrate.

In an embodiment of the present application, when the substrate 1 is a flexible polymer substrate or an ultra-thin metal substrate having poor barrier properties against water and oxygen, in order to effectively isolate water and oxygen from penetrating into the interior of the device via the substrate, preferably, as shown in FIG. 3, a second protective layer 6 is provided between the substrate 1 and the bottom electrode 2, and the second protective layer 6 is preferably made from a fluoro-acrylate copolymer, in which, the fluoro-acrylate copolymer includes, but is not limited to, a functional group structure having at least one selected from —$C_2F_5$, —$C_3F_7$, —$C_4F_9$, —$C_5F_{11}$, —$C_6F_{13}$, —$C_7F_{15}$, and —$C_8F_{17}$. And preferably, the fluoro-acrylate copolymer that adopts the functional group structure including —$C_2F_5$, —$C_3F_7$, —$C_4F_9$, —$C_5F_{11}$, —$C_6F_{13}$, —$C_7F_{15}$, or —$C_8F_{17}$ is used as the material of the second protective layer 6. The preferred material is adhesive and hydrophobic, and can be in full contact with the region to be protected, so as to isolate the region to be protected from oxygen and air. The preferred material also has good light transmission and heat dissipation. The second protective layer 6 is preferably a nano-sized protective layer, in order to further improve the transmittance of the protective layer. More preferably, the second protective layer 6 is a membrane having a thickness of from 50 to 300 nm.

The combination of the second protective layer 6 and the first protective layer 5 achieves the full protection of the functional layer formed by the bottom electrode 2, the light-emitting function layer 3, and the top electrode 4, so as to effectively prevent water and oxygen from penetrating into the internal structure of the quantum dot light emitting diode via the substrate 1, thereby having good protection effect, in the meanwhile, allows the quantum dot light emitting diode to dissipate heat timely during operation, which is beneficial for the device to work better, improve the light-emitting efficiency, and prolong the service life thereof. In addition, the preferred material does not react with materials of the substrate 1 and the bottom electrode 2 of the quantum dot light emitting diode, and is inexpensive in production, environmentally friendly, and non-toxic to humans.

In an embodiment of the present application, the bottom electrode 2, the light-emitting function layer 3, and the top electrode 4 can be obtained by a conventional process using conventional materials in the art. For example, the bottom electrode 2 can be made of a conventional anode material, specifically, the bottom electrode 2 can be an ITO electrode; the light-emitting function layer 3 can be a conventional luminescent material; the top electrode 4 can be a conventional cathode material. Specifically, the top electrode 4 can be an aluminum electrode. In addition to the light-emitting layer, the light-emitting function layer 3 may include a commonly used auxiliary functional layer, such as a hole transport layer and an electron transport layer, and may also include unnecessary hole injection layer, electron injection layer, electronic blocking layer etc., which may be provided according to actual needs.

The quantum dot light emitting diode provided by an embodiment of the present application includes the substrate 1, the bottom electrode 2, the light-emitting function layer 3, and the top electrode 4. An outer surface of the functional layer formed by the bottom electrode 2, the light-emitting function layer 3, and the top electrode 4 is covered with the first protective layer 5. The first protective layer 5 is made from the fluoro-acrylate copolymer, which has hydrophobicity, good transmittance, flexibility, and heat dissipation, and can effectively prevent water and oxygen from penetrating into the internal structure of the quantum dot light emitting diode, thereby having good protection effect. In the meanwhile, the quantum dot light emitting diode can dissipate heat timely during operation, which is beneficial for the device to work better, improve the light-emitting efficiency, and prolong the service life thereof.

The quantum dot light emitting diode according to the embodiments of the present application may be fabricated by the following method.

Figure 4:
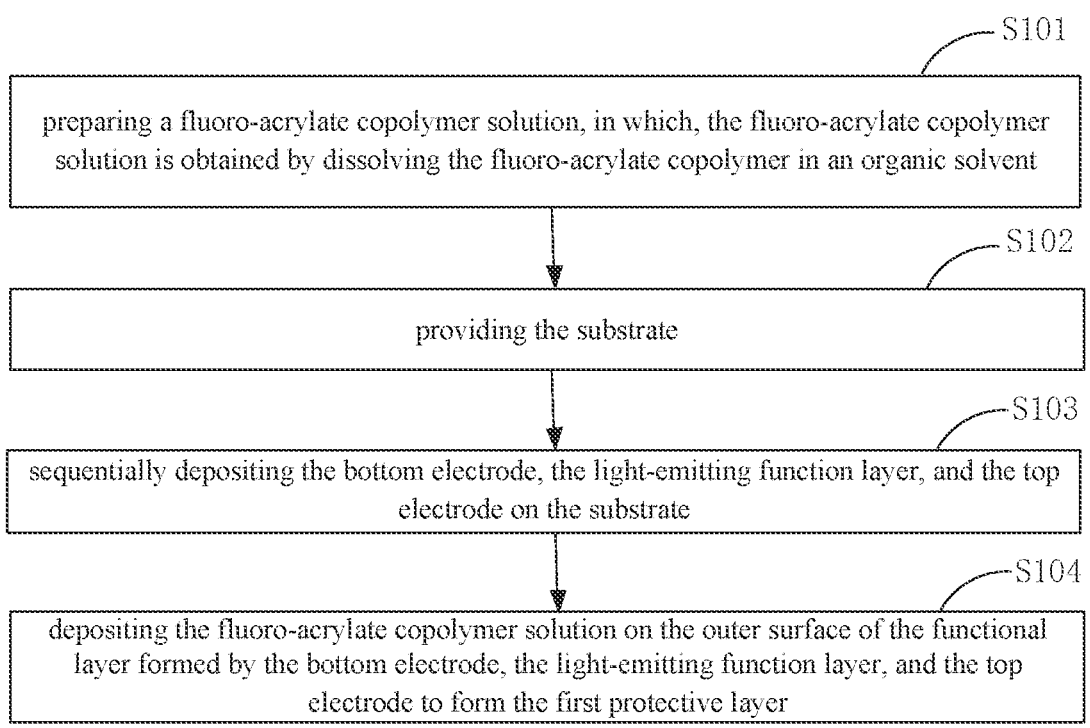
FIG. 4 is a flowchart of a method for fabricating the quantum dot light emitting diode of FIG. 1 according to an embodiment of the present application.
Figure 5:
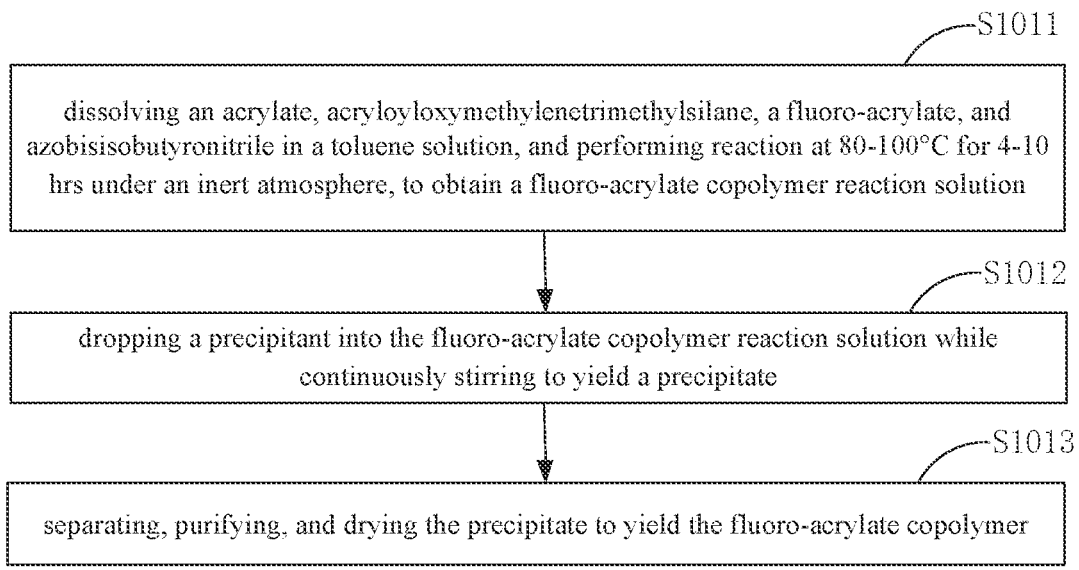
FIG. 5 is a schematic flow chart of a method for preparing the fluoro-acrylate copolymer according to an embodiment of the present application.

Accordingly, with reference to FIGS. 4-5, an embodiment of the present application provides a schematic flowchart of a method for fabricating the quantum dot light emitting diode as described in the above corresponding to FIG. 1. As shown in FIG. 4, the method includes steps S101, S102, S103, and S104. Specifically:

Step S101: preparing a fluoro-acrylate copolymer solution, in which, the fluoro-acrylate copolymer solution is obtained by dissolving the fluoro-acrylate copolymer in an organic solvent.

In an embodiment of the present application, the fluoro-acrylate copolymer solution is a solution formed by dissolving the fluoro-acrylate copolymer in the organic solvent, in which, the selection of the fluoro-acrylate copolymer material and its preferred types are described in the above embodiment, which will not be repeated again herein for the simplicity. The organic solvent is used to dissolve the fluoro-acrylate copolymer, and is preferably at least one selected from acetone, tetrahydrofuran, toluene, ethyl acetate, and chloroform.

In an embodiment of the present application, when the membrane is deposited by the fluoro-acrylate copolymer solution, the concentration of the fluoro-acrylate copolymer in the solution has a great influence on the compactness of the membrane. In case that the concentration is too low, it is difficult to form a compact membrane; and in case that the concentration is too high, it is difficult to form a uniform membrane. Therefore, as a preferred embodiment, the concentration of the fluoro-acrylate copolymer in the fluoro-acrylate copolymer solution is 50-300 mg/mL, and the compactness and thickness of membrane protective layer, can be adjusted by adjusting the concentration of the solution.

With reference to FIG. 5, which is a schematic flowchart of a method for preparing the fluoro-acrylate copolymer in step S101 according to an embodiment of the present application, the method for preparing the fluoro-acrylate copolymer in step S101 includes steps S1011, S1012, and S1013. Specifically:

Step S1011: dissolving an acrylate, acryloyloxymethylenetrimethylsilane, a fluoro-acrylate, and azobisisobutyronitrile in a toluene solution, and performing reaction at 80-100° C. for 4-10 hrs under an inert atmosphere, to obtain a fluoro-acrylate copolymer reaction solution.

In which, the acrylate may specifically be methyl acrylate; the fluoro-acrylate may specifically be at least one selected from perfluoroethylethyl acrylate, perfluorobutylethyl acrylate, perfluoropentylethyl acrylate, and perfluorohexylethyl acrylate; and the inert atmosphere may specifically be a nitrogen atmosphere.

In an embodiment of the present application, the weights of the respective reaction raw materials for the fluoro-acrylate copolymer reaction solution are set according to the polymerization degree of the desired fluoro-acrylate copolymer. Specifically, a weight range of the acrylate is preferably from 10 to 50 g; a weight range of acryloyloxymethylenetrimethylsilane is preferably from 0.5 to 2 g, a weight range of the fluoro-acrylate is preferably from 1 to 5 g, a weight range of azobisisobutyronitrile is preferably from 0.1 to 0.5 g, and the toluene solution is preferably from 10 to 250 ml.

In an embodiment of the present application, after the acrylate, acryloyloxymethylenetrimethylsilane, the fluoro-acrylate, and azobisisobutyronitrile are dissolved in the toluene solution, the reaction condition has a greater influence on the preparation of the fluoro-acrylate copolymer in the fluoro-acrylate copolymer reaction solution, and the reaction condition of the solution is preferably reaction at 80-100° C. for 4-10 hrs under a nitrogen atmosphere.

Step S1012: dropping a precipitant into the fluoro-acrylate copolymer reaction solution while continuously stirring to yield a precipitate.

In an embodiment of the present application, the term "precipitant" refers to a polar organic solvent capable of precipitating the fluoro-acrylate copolymer from the fluoro-acrylate copolymer reaction solution, and may specifically be a methanol solution. When the fluoro-acrylate copolymer reaction solution is added with the methanol solution dropwisely and continuously stirred, the fluoro-acrylate copolymer can be precipitated.

S1013: separating, purifying, and drying the precipitate to yield the fluoro-acrylate copolymer.

In an embodiment of the present application, when the fluoro-acrylate copolymer is precipitated in the above step, fluoro-acrylate copolymer needs to be separated from the solution and purified. First, the separated fluoro-acrylate copolymer with a low purity is dissolved with an organic solvent (the organic solvent is preferably tetrahydrofuran), dissolved, and then added with a precipitant dropwisely and continuously stirred to precipitate the fluoro-acrylate copolymer again. The above operations were repeated three times in order to increase the purity of the fluoro-acrylate copolymer. When the fluoro-acrylate copolymer is sufficiently pure, the fluoro-acrylate copolymer with a high purity is dried, and the drying condition is preferably drying under vacuum at 25-60° C.

The preparation steps of the fluoro-acrylate copolymer are described hereinbelow in conjunction with a specific embodiment.

Methyl acrylate (20 g), acryloyloxymethylenetrimethylsilane (1 g), the fluoro-acrylate (2 g), and azobisisobutyronitrile (0.2 g) were dissolved in toluene (50 mL), and reacted at 90° C. under a nitrogen atmosphere for 5 hours. When the reaction was completed, the fluoro-acrylate copolymer reaction solution was added dropwisely to a methanol solution which was continuously stirred to precipitate a white precipitate. The white precipitate was dissolved in tetrahydrofuran and then precipitated with methanol, the above operations were repeated for three times. Finally, the fluoro-acrylate copolymer was dried under vacuum at 45° C.

The preparation method of the fluoro-acrylate copolymer provided by the embodiment of the present application, involves the preparation of the fluoro-acrylate copolymer reaction solution, the precipitation, separation, purification, and drying of the fluoro-acrylate copolymer, the method is simple and easily controllable and has relatively good application prospects.

Step S102: providing the substrate.

In an embodiment of the present application, the selection of the substrate is not limited, and a flexible substrate or a rigid substrate may be employed. The flexible substrate may specifically be a flexible polymer substrate; and the hard substrate may specifically be a glass substrate or a metal substrate.

Step S103: sequentially depositing the bottom electrode, the light-emitting function layer, and the top electrode on the substrate.

In an embodiment of the present application, the selection of materials for the bottom electrode, the light-emitting function layer, and the top electrode, and the preferred types thereof are as described in the above, which will not be repeated again herein for the simplicity.

Step S104: depositing the fluoro-acrylate copolymer solution on the outer surface of the functional layer formed by the bottom electrode, the light-emitting function layer, and the top electrode to form the first protective layer.

In an embodiment of the present application, the selection of the material for the first protective layer and its preferred types are as described in the above embodiment, which will not be repeated again herein for simplicity.

In an embodiment of the present application, the fluoro-acrylate copolymer solution is deposited on the outer surface of the functional layer formed by the bottom electrode, the light-emitting function layer, and the top electrode. The deposition can be implemented by various methods, which preferably includes, but not limited to, at least one of spin coating, dripping, ink jet printing, and dipping, a membrane protective layer with good uniformity and controllable thickness can be obtained by the above methods, in this way, the first protective layer has a controllable thickness, flexibility, and toughness. The above method requires neither post-heating treatment nor UV curing, thereby being simple to operate.

Specifically, when the spin coating is employed, the method may be carried out as follows: the quantum dot light emitting diode prepared in step S103 is placed on a spin coater, and then the fluoro-acrylate copolymer solution is deposited onto the outer surface other than the bottom of the substrate via spin coating. Further, in an embodiment of the present application, the thickness of the first protective layer can be controlled by regulating the rotational speed of the spin coater. Preferably, the rotational speed of the spin coating is from 1000 to 6000 rpm, thereby obtaining a uniform membrane layer with a controllable thickness.

The method for preparing the quantum dot light emitting diode according to the embodiments of the present application is achieved by preparing the fluoro-acrylate copolymer solution, depositing the fluoro-acrylate copolymer solution onto the outer surface of the functional layer, which is formed by the bottom electrode, the light-emitting function layer, and the top electrode, so as to form the first protective layer, thereby effectively preventing water and oxygen from penetrating into the internal structure of the quantum dot light emitting diode. In the meanwhile, the thickness of the first protective layer can be controlled according to the concentration and preparation process of the fluoro-acrylate copolymer solution, thereby achieving the adjustability of the thickness thereof. The preparation method thereof does no need post-heating treatment or UV lamp irradiation treatment, thus being simple and easy to control. The first protective layer deposited is a nano-sized membrane material, and the usage of the raw material is small, thereby saving the production cost.

Figure 6:
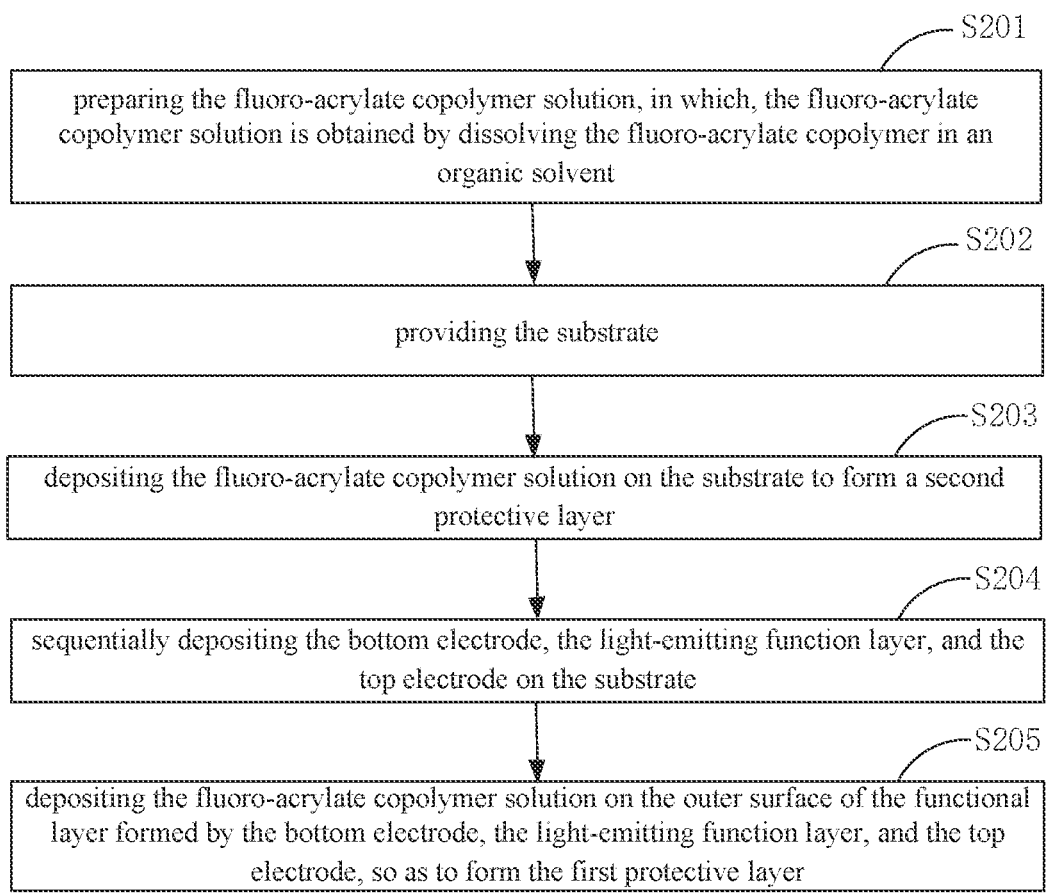
FIG. 6 is a flowchart of a method for fabricating the quantum dot light emitting diode of FIG. 3 according to an embodiment of the present application.

Please refer to FIG. 6, which is a schematic diagram of a method for fabricating the above-described quantum dot light emitting diode provided by another embodiment of the present application corresponding to FIG. 3. The method includes the following steps:

Step S201: preparing the fluoro-acrylate copolymer solution, in which, the fluoro-acrylate copolymer solution is obtained by dissolving the fluoro-acrylate copolymer in an organic solvent.

In an embodiment of the present application, the selection of the materials for the fluoro-acrylate copolymer solution, the fluoro-acrylate copolymer, and the organic solvent, preparation method thereof, and preferred types thereof are as described in step S101, which is not repeated herein again for the simplicity.

Step S202: providing the substrate.

In an embodiment of the present application, the selection of the substrate specifically uses a flexible substrate or a metal substrate, and more specifically, the flexible substrate is specifically a flexible polymer substrate or an ultra-thin metal substrate.

Step S203: depositing the fluoro-acrylate copolymer solution on the substrate to form a second protective layer.

In an embodiment of the present application, as the substrate in the above-described step employs a flexible polymer substrate or an ultra-thin metal substrate. In order to effectively isolate water and oxygen from penetrating into the interior of the device via the substrate, the fluoro-acrylate copolymer solution is preferably deposited between the substrate and the bottom electrode to form the second protective layer, and then the bottom electrode is deposited on the surface of the second protective layer to isolate water and oxygen. The fluoro-acrylate copolymer solution is as described in the above, and will not be repeated herein for simplicity. The second protective layer is adhesive and hydrophobic, and can be in full contact with the region to be protected, so as to isolate the region to be protected from oxygen and air. The second protective layer also has good light transmission and heat dissipation, and can effectively prevent water and oxygen from penetrating into the internal structure of the quantum dot light emitting diode via the substrate, thereby having good protection effect, in the meanwhile, allow the quantum dot light emitting diode to dissipate heat timely during operation, which is beneficial for the device to work better, improve the light-emitting efficiency, and prolong the service life thereof.

In an embodiment of the present application, the fluoro-acrylate copolymer solution is deposited on the substrate. The deposition can be implemented by various methods, which preferably include, but not limited to, at least one of spin coating, dripping, ink jet printing, and dipping, a membrane protective layer with good uniformity and controllable thickness can be obtained by the above methods, in this way, the second protective layer has a controllable thickness, flexibility, and toughness. The above method requires neither post-heating treatment nor UV curing, thereby being simple to operate.

Specifically, when the spin coating is employed, the method may be carried out as follows: the substrate prepared in step S202 is placed on a spin coater, and then the fluoro-acrylate copolymer solution is deposited onto the substrate via spin coating, thereafter, the bottom electrode is deposited on the surface of the second protective layer. Further, in an embodiment of the present application, the thickness of the first protective layer can be controlled by regulating the rotational speed of the spin coater. Preferably, the rotational speed of the spin coating is from 1000 to 6000 rpm, thereby obtaining a uniform membrane layer with a controllable thickness.

Step S204: sequentially depositing the bottom electrode, the light-emitting function layer, and the top electrode on the substrate.

In an embodiment of the present application, the selection of materials for the bottom electrode, the light-emitting function layer, and the top electrode and the preferred types thereof are as described in above and will not be repeated herein again for simplicity.

Step S205: depositing the fluoro-acrylate copolymer solution on the outer surface of the functional layer formed by the bottom electrode, the light-emitting function layer, and the top electrode, so as to form the first protective layer.

In an embodiment of the present application, selection of the material for the first protective layer and the preferred type thereof are as described in step S104 in the above embodiment, which will not be repeated herein for simplicity. The deposition of the fluoro-acrylate copolymer solution is as described in step S104, which will not be repeated herein for simplicity.

The method for preparing the quantum dot light emitting diode according to the embodiments of the present application is achieved by preparing the fluoro-acrylate copolymer solution, depositing the fluoro-acrylate copolymer solution onto the outer surface of the functional layer, which is formed by the bottom electrode, the light-emitting function layer, and the top electrode, so as to form the first protective layer, and depositing the fluoro-acrylate copolymer solution on the substrate to form the second protective layer, thereby effectively double blocking water and oxygen from penetrating into the internal structure of the quantum dot light emitting diode. In the meanwhile, the thickness of the first protective layer and the second protective layer can be controlled according to the concentration and preparation process of the fluoro-acrylate copolymer solution, thereby achieving the adjustability of the thickness thereof. The preparation method thereof does no need post-heating treatment or UV lamp irradiation treatment, thus being simple and easy to control. The deposited first protective layer and second protective layer are both nano-sized membrane materials, and the usage of the raw materials is small, thereby saving the production cost.

The above are only the preferred embodiments of the present application, and are not intended to limit the present application. Any modifications, equivalents, and improvements made within the spirit and principle of the present application should be included within the protection scope of the present application.

What is claimed is:

1. A quantum dot light emitting diode, comprising:
a substrate, a bottom electrode, a light-emitting function layer, and a top electrode arranged in sequence,
wherein
a functional layer is formed by the bottom electrode, the light-emitting function layer, and the top electrode; and an outer surface of the functional layer is provided with a first protective layer made from a fluoro-acrylate copolymer;
the fluoro-acrylate copolymer has a molecular structure as follows:

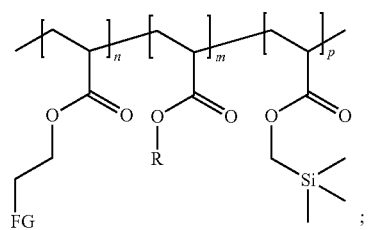

in which, FG is a fluorine-containing functional group, R is an alkane group, n is an integer of from 1 to 50, m is an integer of from 1 to 10,000, and p is an integer of from 1 to 50.

2. The quantum dot light emitting diode of claim 1, wherein the first protective layer has a thickness of from 50 to 300 nm.

3. The quantum dot light emitting diode of claim 1, wherein a second protective layer is arranged between the substrate and the bottom electrode, and the second protective layer is made from a fluoro-acrylate copolymer.

4. The quantum dot light emitting diode of claim 3, wherein the second protective layer has a thickness of from 50 to 300 nm.

5. The quantum dot light emitting diode of claim 1, wherein n is an integer of from 10 to 30, m is an integer of from 500 to 7000, and p is an integer of from 10 to 30.

6. The quantum dot light emitting diode of claim 1, wherein the —FG in the molecular structure is at least one selected from —$C_2F_5$, —$C_3F_7$, —$C_4F_9$, —$C_5F_{11}$, —$C_6F_{13}$, —$C_7F_{15}$, and —$C_8F_{17}$.

7. A method for fabricating the quantum dot light emitting diode according to claim 1, wherein the method comprises the steps of:
preparing a fluoro-acrylate copolymer solution, wherein the fluoro-acrylate copolymer solution is obtained by dissolving the fluoro-acrylate copolymer in an organic solvent;
providing the substrate;
sequentially depositing the bottom electrode, the light-emitting function layer, and the top electrode on the substrate; and
depositing the fluoro-acrylate copolymer solution on the outer surface of the functional layer formed by the bottom electrode, the light-emitting function layer, and the top electrode, to form the first protective layer.

8. The method according to claim 7, wherein before depositing the bottom electrode on the substrate, the method further comprises the step of depositing the fluoro-acrylate copolymer solution on the substrate to form a second protective layer, after which, the bottom electrode is deposited on the second protective layer surface.

9. The method according to claim 7, wherein the concentration of the fluoro-acrylate copolymer in the fluoro-acrylate copolymer solution is 50 to 300 mg/mL.

10. The method according to claim 7, wherein preparation of the fluoro-acrylate copolymer includes the following steps:
dissolving an acrylate, acryloyloxymethylenetrimethylsilane, a fluoro-acrylate, and azobisisobutyronitrile in a toluene solution, and performing reaction at 80-100° C. for 4-10 hrs under an inert atmosphere to obtain a fluoro-acrylate copolymer reaction solution;
dropping a precipitant to the fluoro-acrylate copolymer reaction solution and continuously stirring the fluoro-acrylate copolymer reaction solution, to obtain a precipitate; and
separating, purifying, and drying the precipitate, to obtain the fluoro-acrylate copolymer.

11. The method according to claim 10, wherein
the acrylate has a weight of from 10 to 50 g; and/or
the acryloyloxymethylenetrimethylsilane has a weight of from 0.5 to 2 g; and/or
the fluoro-acrylate has a weight of from 1 to 5 g; and/or
the azobisisobutyronitrile has a weight of from 0.1 to 0.5 g.

12. The method according to claim 10, wherein the toluene solution has a volume of from 10 to 250 mL.

13. The method according to claim 10, wherein the acrylate is methyl acrylate; and/or
the fluoro-acrylate is at least one selected from perfluoroethylethyl acrylate, perfluorobutylethyl acrylate, perfluoropentylethyl acrylate, and perfluorohexylethyl acrylate.

14. The method according to claim 7, wherein the organic solvent is at least one selected from acetone, tetrahydrofuran, toluene, ethyl acetate, and chloroform.

15. The method according to claim 8, wherein the deposition in the operation of depositing the fluoro-acrylate copolymer solution onto the top electrode and/or the deposition in the operation of depositing the fluoro-acrylate copolymer solution onto the substrate include at least one selected from spin coating, dripping, inkjet printing, and dipping.

16. The method according to claim 8, wherein the concentration of the fluoro-acrylate copolymer in the fluoro-acrylate copolymer solution is 50 to 300 mg/mL.

* * * * *